US007528454B2

(12) United States Patent
Takaishi

(10) Patent No.: US 7,528,454 B2
(45) Date of Patent: May 5, 2009

(54) SEMICONDUCTOR MEMORY WITH SENSE AMPLIFIER

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 115 days.

(21) Appl. No.: 11/526,014

(22) Filed: Sep. 25, 2006

(65) Prior Publication Data

US 2007/0069279 A1 Mar. 29, 2007

(30) Foreign Application Priority Data

Sep. 26, 2005 (JP) ............................. 2005-277812
Aug. 1, 2006 (JP) ............................. 2006-210006

(51) Int. Cl.
*H01L 21/8242* (2006.01)
(52) U.S. Cl. ........................ 257/397; 257/401; 257/501; 257/516; 257/E27.097; 257/E21.629
(58) Field of Classification Search ................. 257/296, 257/397, 401, 501, 510, 516, E27.097, E21.628
See application file for complete search history.

(56) References Cited

U.S. PATENT DOCUMENTS

| 6,469,335 B2* | 10/2002 | Hofmann ..................... 257/296 |
| 6,747,320 B2 | 6/2004 | Nakabayashi |
| 6,891,761 B2* | 5/2005 | Kumagai et al. ............ 257/206 |
| 2002/0149044 A1* | 10/2002 | Nakanishi et al. ........... 257/296 |
| 2005/0018466 A1* | 1/2005 | Kurth et al. .................... 365/94 |
| 2007/0013024 A1* | 1/2007 | Kutsukake et al. .......... 257/510 |

FOREIGN PATENT DOCUMENTS

JP 6-13574 1/1994
JP 8-236767 9/1996
JP 2003-068880 3/2003
JP 2004-071903 3/2004

OTHER PUBLICATIONS

Japanese Office Action dated May 7, 2008 with partial English Translation.

* cited by examiner

*Primary Examiner*—George Fourson
(74) *Attorney, Agent, or Firm*—McGinn IP Law Group, PLLC

(57) ABSTRACT

The present invention provides a semiconductor memory which has sense amplifiers, each including a pair of MOSFETs having complete symmetry in regard to not only the shape but also to the impurity profile in a diffusion layer, and the present invention is also capable of reducing variations in electric characteristics, and provides a method of manufacturing the same. Annular gate electrodes 12a, 12b are formed on diffusion layer 11. Gate electrodes 13 are formed simultaneously with a sense amplifier along edges of diffusion layer 11 to bestride the boundary between diffusion layer 11 and r shallow trench isolation area 20. Contacts 16 are formed on diffusion layer 11; contacts 17a, 17b on diffusion layer 11 within annular gate electrodes 12a, 12b, respectively; and contacts 18 on gate electrodes 12a, 12b of the sense amplifier. All components are arranged in symmetry, and gate electrodes 13 running along the edges of diffusion layer 11 hold the same spacings 14, 15 between gate electrodes 12a, 12b and gate electrodes 13, so that an impurity profile in diffusion layer 11 is not affected by the edges of shallow trench isolation area 20. Consequently, the MOSFETs are arranged in complete symmetry and contribute to a reduction of variation in the characteristics.

12 Claims, 6 Drawing Sheets

SEMICONDUCTOR MEMORY WITH SENSE AMPLIFIER

BACKGROUND OF THE INVENTION

1. Field of the Invention:

The present invention relates to a semiconductor memory and a method of manufacturing the same, and more particularly, to a semiconductor device which has sense amplifiers, each including a pair of MOSFETs arranged in complete symmetry, and can therefore reduce variations in electric characteristics, and a method of manufacturing the same.

2. Description of the Related Art:

With increasingly higher miniaturization, integration, and performance of semiconductor memories, DRAMs have also been reduced in cell size and memory capacity has increased. In addition, the need for high performance requires the use of lower operating voltages, so that variations in the characteristics of transistors exerts an increasingly larger influence.

In the operation of a DRAM, the charge accumulated on a capacitor for each cell in the DRAM increases the potential on a bit line by a subtle value, and this subtle potential is amplified by a sense amplifier to determine data "1" or "0" which is then relied on by the device to operate. The trend of higher miniaturization and integration make it difficult to ensure the memory capacity of cells in the DRAM, and faster operations require a reduction in voltage, so that the sense amplifier is required for perform more and more important roles.

The sense amplifier is a semiconductor device formed of at least one pair of MOSFETs which are required to have a high symmetry in regard to their characteristics. While problems can arise from variations in the characteristics of the respective MOSFETs themselves, the most critical issue lies in variations in differences in respective characteristics between the pair of MOSFETs. Since a difference in these characteristics, if any, results in a signal with a reduced amount of information due to the miniaturization of DRAMs and a reduction in voltage, even a subtle difference in characteristics is more likely to affect the operation of the sense amplifier and cause malfunctions.

FIG. 1 illustrates the planar structure of a conventional general sense amplifier. FIG. 1 is a schematic plan view illustrating the arrangement of a sense amplifier for reducing variations in difference in characteristics of a pair of MOSFETs which form part of the sense amplifier, disclosed in JP-A-6-13574.

Annular gate electrodes 62a, 62b are formed on diffusion layer 61. Also, contacts 66 are formed on diffusion layer 61, contacts 67a, 67b are formed on diffusion layer 61 within gate electrodes 62, and contacts 68 are formed on gate electrodes 62a, 62b of the sense amplifier. Shallow trench isolation (STI) area 70 is defined around diffusion layer 61.

Assume that MOSFET 6a and MOSFET 6b are a pair of MOSFETs which operate as a sense amplifier. In MOSFET 6a, current flows between contact 67a and contact 66 through gate electrode 62a. In MOSFET 6b, current flows between contact 67b and contact 66 through gate electrode 62b. Since contact 67a and contact 67b are arranged in symmetry about the center of the sense amplifier on the top surface of diffusion layer 61, variations are reduced in the difference in characteristics between MOSFET 6a and MOSFET 6b.

However, even in the semiconductor memory described in JP-A-6-13574, a constant distance cannot always be ensured from gate electrodes 62a, 62b to STI area 70 for element isolation. If gate electrodes 62a, 62b are shifted in position in the processing step for forming them on diffusion layer 61, diffusion layer spacing 64 between gate electrode 62a and STI area 70 in MOSFET 6a will differ from diffusion layer spacing 65 between gate electrode 62b and STI area 70, thus causing MOSFET 6a and MOSFET 6b of the sense amplifier to lose the symmetry.

Also, in some methods of placing the foregoing components on diffusion layer 61, STI area 70 can be formed with edges having different shapes, which connect to diffusion layer spacing 64 and to diffusion layer spacing 65, resulting in a different impurity profile.

Even at least the two aspects described above will cause a difference in characteristics of MOSFET 6a and MOSFET 6b, giving rise to a subtle difference in characteristics of a resulting DRAM. The increasing miniaturization of DRAMs and more reduction in voltages used therein give rise to a problem in which even a subtle difference, if any, affects the operation of the sense amplifier and increases the possibility of malfunctions.

SUMMARY OF THE INVENTION:

It is an object of the present invention to provide a semiconductor memory which has sense amplifiers, each including a pair of MOSFETs in complete symmetry in regard not only to the shape but also to an impurity profile in a diffusion layer, and which is also capable of reducing variations in electric characteristics, and a method of manufacturing the same.

A semiconductor memory of the present invention has a sense amplifier formed of at least one pair of MOSFETs, wherein the pair of MOSFETs are arranged in point symmetry to each other about the center of the sense amplifier, and the semiconductor memory further comprises additional gate electrodes each formed in an area in which the diffusion layer formed in the sense amplifier is in contact with a shallow trench isolation area for defining the sense amplifier such that the gate electrode spreads over the diffusion layer and each shallow trench isolation area.

Preferably, the gate electrodes are formed to spread over the diffusion layer and the shallow trench isolation area such that side edges thereof hold the same spacing from side edges of gate electrodes in the pair of MOSFETs. An inter-layer insulating film may be formed in internal areas surrounded by annular gate electrodes of the MOSFETs, and over an area outside the gate electrodes including the gate electrodes formed along the edges of the diffusion layer in contact with the shallow trench isolation area, and contacts may be formed through the inter-layer insulating film. Poly-pads may be formed in internal areas surrounded by annular gate electrodes of the MOSFETs, and over an area outside the gate electrodes, independently of one another, an inter-layer insulating film may be formed on the poly-pads including the gate electrodes formed along the edges of the diffusion layer in contact with the shallow trench isolation area, and contacts may be formed through the inter-layer insulating film.

A method of manufacturing a semiconductor memory of the present invention is provided for manufacturing a semiconductor memory having additional gate electrodes in regions in which a shallow trench isolation area for defining a sense amplifier is in contact with a diffusion layer for forming the sense amplifier. In a first aspect, the method comprises the steps of:

forming the shallow trench isolation area in a silicon substrate which is to serve as the diffusion layer;

laminating a gate insulating film, a lower gate electrode, and an upper gate electrode on the silicon substrate, and depositing a mask nitride film on the upper gate electrode;

forming annular gate electrodes of MOSFETs and simultaneously forming gate electrodes in the regions in which the diffusion layer is in contact with the shallow trench isolation area using a photolithographic process and an etching process;

forming a diffusion layer having a low impurity concentration in the silicon substrate using an ion injection process, forming side wall insulating films on side surfaces of the gate electrodes, and depositing and planarizing an inter-layer insulating film over the silicon substrate; and opening contact holes within the annular gate electrodes using a normal photolithographic process and etching process, and embedding W into the contact holes to form contacts.

In a second aspect, the method comprises the steps of:

forming the shallow trench isolation area in a silicon substrate which is to serve as the diffusion layer;

laminating a gate insulating film, a lower gate electrode, and an upper gate electrode on the silicon substrate, and depositing a mask nitride film on the upper gate electrode;

forming annular gate electrodes and simultaneously forming gate electrodes in the regions in which the diffusion layer is in contact with the shallow trench isolation area using a photolithographic process and an etching process;

forming a diffusion layer having a low impurity concentration in the silicon substrate using an ion injection process, forming side wall insulating films on side surfaces of the gate electrodes, and depositing and planarizing polysilicon over the silicon substrate;

forming poly-pads from the polysilicon, and depositing and planarizing a first inter-layer insulating film;

forming a mask for forming the gate electrodes using the first inter-layer, forming side walls opposite to the sense amplifier of the gate electrodes formed in the areas in which the diffusion layer is in contact with the shallow trench isolation area, and etching the upper gate electrode and the lower gate electrode; and depositing and planarizing a second inter-layer insulating film on the first inter-layer insulating film, opening contact holes through the polysilicon within the annular gate electrodes using a normal photolithographic process and etching process, and embedding W into the contact holes to form contacts.

Contacts may be formed on the diffusion layer and the gate electrodes simultaneously with the step of forming contacts within the annular gate electrodes.

The present invention provides a semiconductor memory having a sense amplifier formed of at least one pair of MOSFETs, wherein additional gate electrodes are formed along the edges of a diffusion layer which forms part of the sense amplifier such that they extend into a shallow trench isolation area, and at least some of these gate electrodes are formed by the same lithographic process as gate electrodes which form part of the sense amplifier, thereby arranging the pair of MOSFETs in complete symmetry in regard to the shape and the impurity profile in the diffusion layer, and also contributing to a reduction in electric variations.

Advantageously, in the semiconductor memory manufactured by the method of the present invention, the operation of the sense amplifier is less susceptible to malfunctions, and the semiconductor memory is improved in performance to accommodate the trend of increasing integration, miniaturization, performance, and reduction in voltage for DRAMs having sense amplifiers each formed of at least one pair of MOSFETs.

This is because the pair of MOSFETs can be arranged in complete symmetry in regard not only to the shape but also to the impurity profile in the diffusion layer to contribute to a reduction in electric variations as well by forming the additional gate electrodes along the edges of the diffusion layer which forms part of the sense amplifier such that they extend into the shallow trench isolation area, and by forming at least some of these gate electrodes by the same lithographic process as the gate electrodes which form part of the sense amplifier.

BRIEF DESCRIPTION OF THE DRAWINGS

FIG. 3 includes schematic cross-sectional views taken along X-X in FIG. 2, illustrating a method of manufacturing the semiconductor memory according to the first embodiment of the present invention, wherein:

FIG. 5 includes schematic cross-sectional views taken along Y-Y in FIG. 4 illustrating a method of manufacturing the semiconductor memory according to the second embodiment of the present invention, wherein:

DETAILED DESCRIPTION OF THE PREFERRED EMBODIMENTS

The present invention relates to the structure of a sense amplifier which has at least one pair of MOSFETs for reducing variations in the characteristics of the sense amplifier, resulting from variations introduced in processes, and a method of manufacturing the same.

Figure 1:
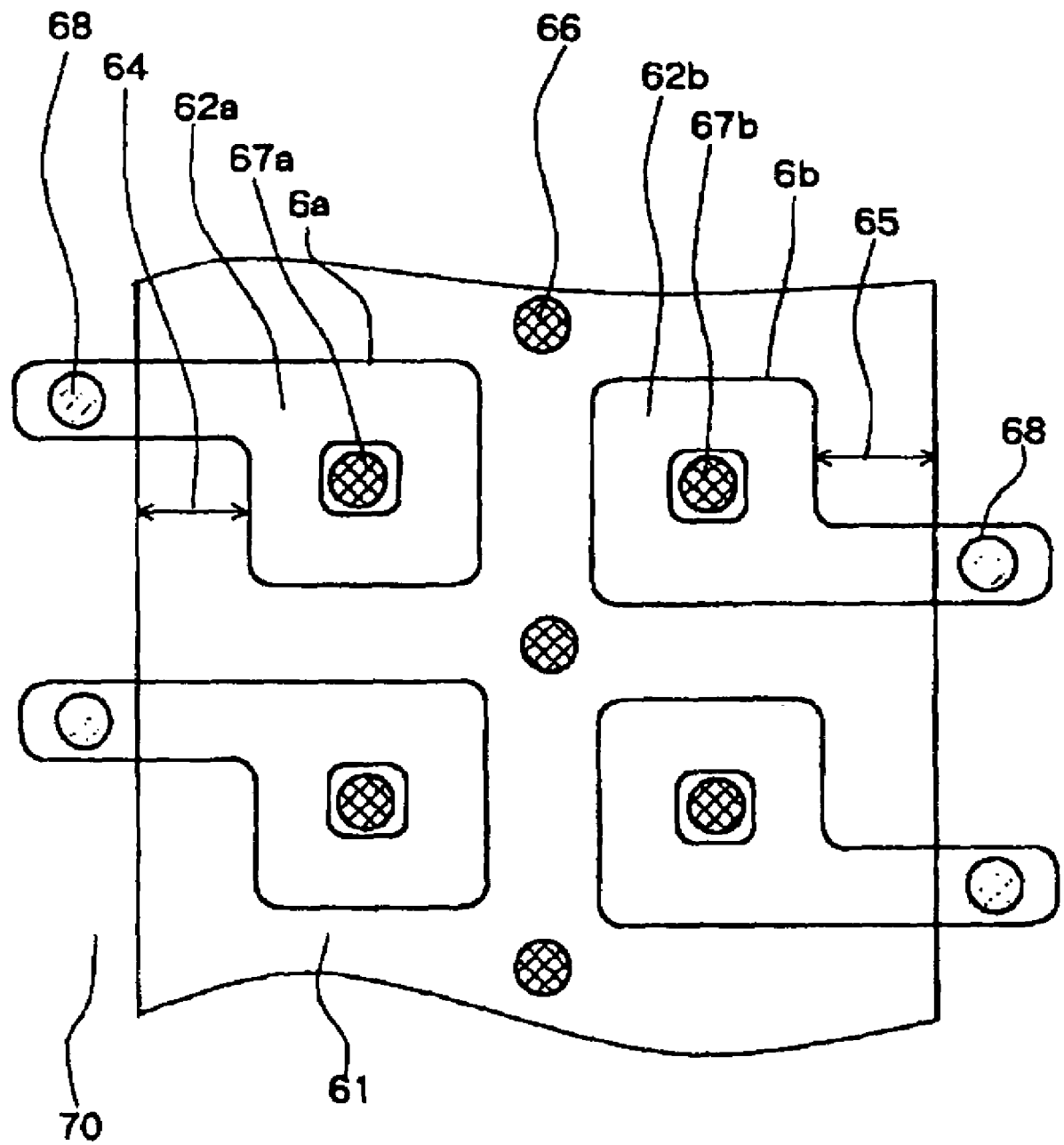
FIG. 1 is a schematic plan view illustrating the arrangement of a sense amplifier for reducing variations in a pair of MOSFETs which form part of the sense amplifier, disclosed in JP-A-6-13574.
Figure 2:
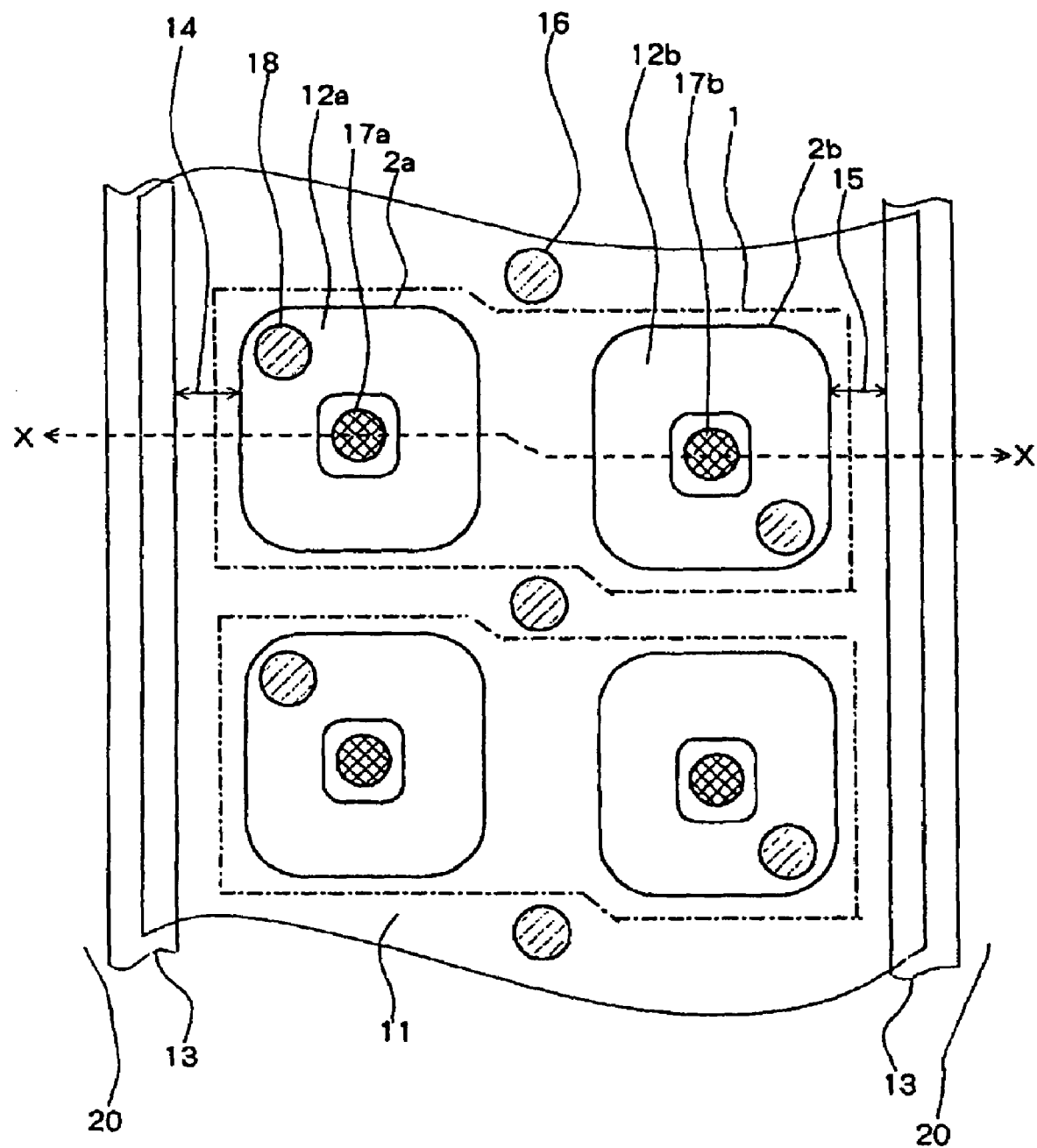
FIG. 2 is a schematic partial plan view illustrating the configuration of a sense amplifier in a semiconductor memory according to a first embodiment of the present invention.

FIG. 2 is a schematic partial plan view illustrating the configuration of a sense amplifier in a semiconductor memory according to a first embodiment of the present invention. Annular gate electrodes 12a, 12b are formed on diffusion layer 11 of sense amplifier 1. Also, gate electrodes 13 are each formed along an edge of diffusion layer 11, simultaneously with sense amplifier 1, to bestride the boundary between diffusion layer 11 and shallow trench isolation (STI) area 20.

Contacts 16 are formed on diffusion layer 11, contacts 17a, 17b are formed on diffusion layer 11 within gate electrodes 12a, 12b, and contacts 18 are formed on gate electrodes 12a, 12b of sense amplifier 1.

Assume that MOSFET 2a and MOSFET 2b are a pair of MOSFETs which operates as a sense amplifier. In MOSFET 2a, current flows between contact 17a and contact 16 through gate electrode 12a. In MOSFET 2b, current flows between contact 17b and contact 16 through gate electrode 12b. All the components are arranged in symmetry about the center of sense amplifier 1, and gate electrodes 13 are arranged along the respective edges of diffusion layer 11. Since gate electrodes 12a, 12b and gate electrodes 13 along the edges of diffusion layer 11 are formed by the same manufacturing process, the same gate electrode spacings 14, 15 can be defined between gate electrode 12a and gate electrode 12b and associated gate electrodes 13 along the edges of diffusion layer 11, respectively.

Also, since gate electrodes 13 along the edges of diffusion layer 11 prevent the impurity profile of diffusion layer 11 from being affected by the edges of STI area 20, MOSFET 2a and MOSFET 2b are in complete symmetry, and can contribute to a reduction in variation in the characteristics.

Further, a constant electric field is generated along the edges of diffusion layer 11 by applying a predetermined potential to gate electrodes 13 along the edges of diffusion layer 11, thus further reducing electric variations. While the predetermined potential is often chosen to be a ground potential, it is not particularly limited to a ground potential.

Next, a method of manufacturing the semiconductor memory according to the first embodiment of the present invention will be described with reference to FIG. 3.

FIG. 3 includes schematic cross-sectional views taken along X-X in FIG. 2, illustrating a method of manufacturing the semiconductor memory according to the first embodiment of the present invention. FIG. 3a is a schematic cross-sectional view illustrating how a gate insulating film, a gate electrode, and a mask nitride film are laminated on a silicon substrate; FIG. 3b is a schematic cross-sectional view illustrating how gate electrodes are formed on the silicon substrate, and how gate electrodes are formed along edges of a diffusion layer; FIG. 3c is a schematic cross-sectional view illustrating formation of a diffusion layer and side wall insulating layers, and subsequent deposition of an inter-layer insulating film; and FIG. 3d is a schematic cross-sectional view illustrating how contacts are formed within annular gate electrodes.

Figure 3A:
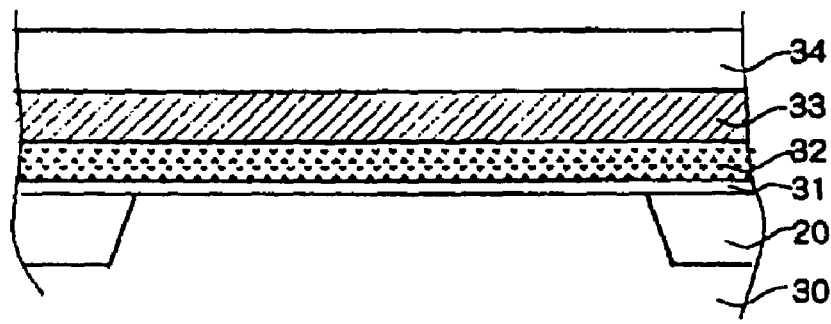
FIG. 3a is a schematic cross-sectional view illustrating how a gate insulating film, a gate electrode, and a mask nitride film are laminated on a silicon substrate.

First, as illustrated in FIG. 3a, shallow trench isolation (STI) area 20 is formed within silicon substrate 30 which is to serve as diffusion layer 11. Next, gate insulating film 31 is formed on silicon substrate 30, and on gate insulating film 31, polysilicon having a thickness of 70 nm is formed to serve as lower gate electrode 32, and W (tungsten)/WN (tungsten nitride) having a thickness of 100 nm is formed to serve as upper gate electrode 33. Next, mask nitride film 34 is deposited in thickness of 120 nm on upper gate electrode 33 because it is required for processing the gate electrodes and forming cell contacts in cell areas.

Figure 3B:
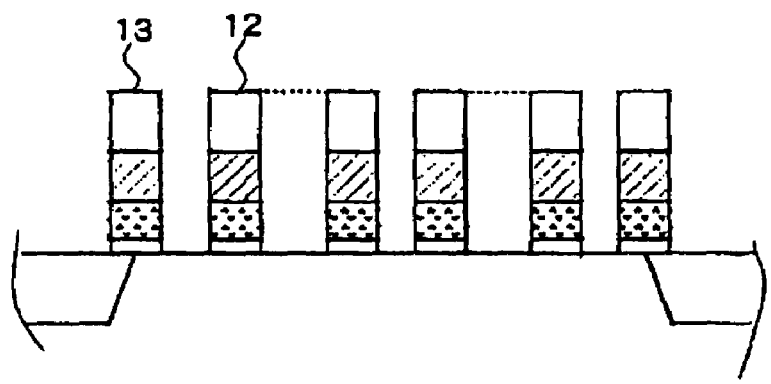
FIG. 3b is a schematic cross-sectional view illustrating how gate electrodes are formed on the silicon substrate, and how gate electrodes are formed along edges of a diffusion layer.

Next, as illustrated in FIG. 3b, gate electrodes 12 are formed using a known photolithographic process and etching process. In this event, gate electrodes 13 are also formed simultaneously along edges of diffusion layer 11 to bestride the boundaries between diffusion layer 11 and STI area 20.

Figure 3C:
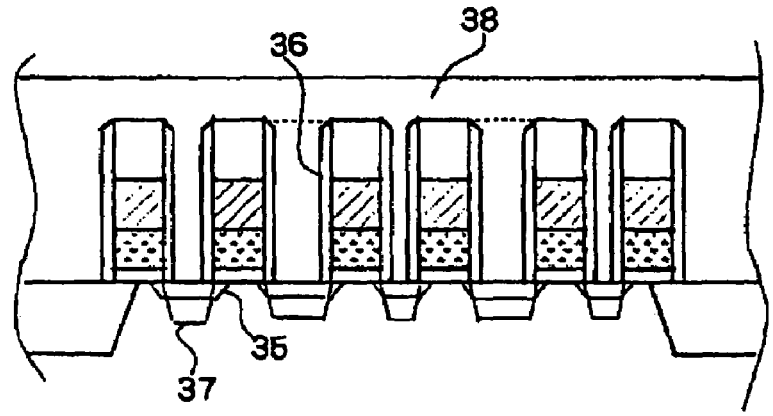
FIG. 3c is a schematic cross-sectional view illustrating formation of a diffusion layer and side wall insulating layers, and subsequent deposition of an inter-layer insulating film.

Next, as illustrated in FIG. 3c, diffusion layer 35 having a low impurity concentration is formed in silicon substrate 30, which is to serve as diffusion layer 11, using an ion injection process.

Next, sidewall insulating films 36 are formed on the side surfaces of gate electrodes 12 to a thickness of approximately 70 nm, and then, diffusion layer 37 having a high impurity concentration is formed in silicon substrate 30, which is to server as diffusion layer 11, using an ion injection process. Next, inter-layer insulating film 38 is deposited and planarized using a known planarization method.

Figure 3D:
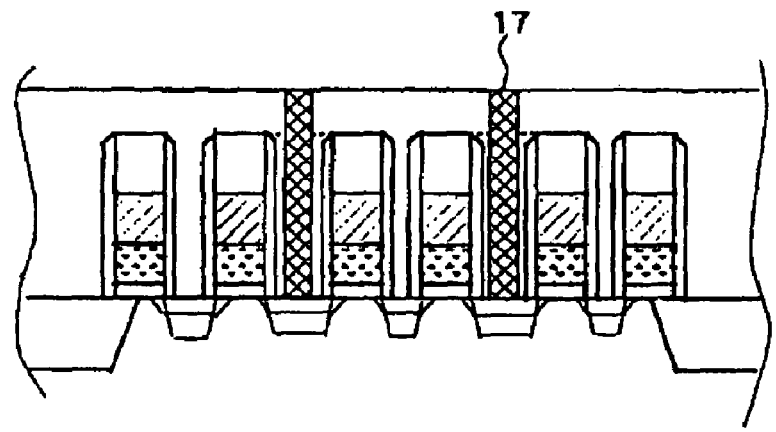
FIG. 3d is a schematic cross-sectional view illustrating how contacts are formed within annular gate electrodes.

Next, as illustrated in FIG. 3d, contact holes are opened for connecting MOSFET bit lines, using a normal photolithographic process and etching process, and are embedded with W to form W plugs, thus forming contacts 17 within annular gate electrodes 12. In this event, contacts 16 on diffusion layer 11 may be formed simultaneously with contacts 18 on gate electrodes 12, or they may be formed separately, without any particular impact on the semiconductor memory of the present invention.

Figure 4:
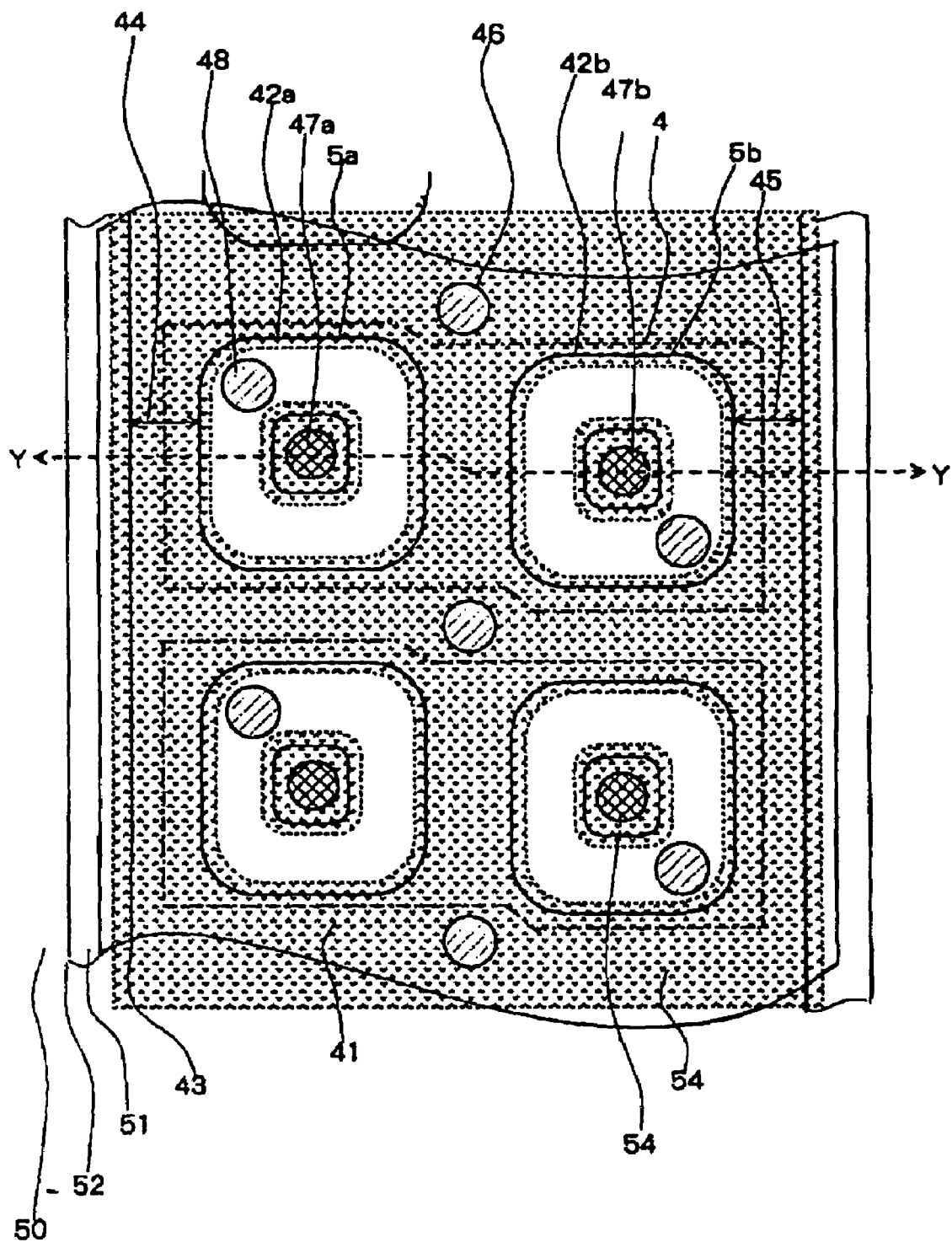
FIG. 4 is a schematic partial plan view illustrating the configuration of a sense amplifier in a semiconductor memory according to a second embodiment of the present invention.

Next, a second embodiment of the present invention will be described with reference to FIG. 4. FIG. 4 is a schematic partial plan view illustrating the configuration of a sense amplifier in a semiconductor memory according to the second embodiment of the present invention.

Annular gate electrodes 42a, 42b are formed on diffusion layer 41 of sense amplifier 4. Also, gate electrodes 51 are formed along edges of diffusion layer 41 to bestride the boundaries between diffusion layer 41 and shallow trench isolation (STI) area 60. Though not shown in FIG. 4, side 43 of each gate electrode 51 running within the sense amplifier is formed simultaneously with gate electrodes in the cell areas of a DRAM, and in annular gate electrodes 42 shown above.

Poly-pads 54 are formed within annular gate electrodes 42a, 42b, and within portions between annular gate electrodes 42a, 43b and gate electrodes 51 formed along the edges of diffusion layer 41. After the formation of poly-pads 54, side 52 of gate electrode 51, formed along each edge of diffusion layer 41, opposite to the sense amplifier, is formed simultaneously with gate electrodes in the periphery, not shown in FIG. 4.

Contacts 46 are formed on poly-pad 54; contacts 47a, 47b on poly-pads 54 formed within annular gate electrodes 42; and contacts 48 on annular gate electrodes 42a, 42b of sense amplifier 4. The second embodiment of the present invention is similar in structure to the first embodiment in that MOSFET 5a and MOSFET 5b are in complete symmetry, and can contribute to a reduction in variation in the characteristics.

Next, a method of manufacturing the semiconductor memory according to the second embodiment of the present invention will be described with reference to FIG. 5. FIG. 5 includes schematic cross-sectional views taken along Y-Y in FIG. 4, illustrating the method of manufacturing the semiconductor memory according to the second embodiment of the present invention.

Figure 5A:
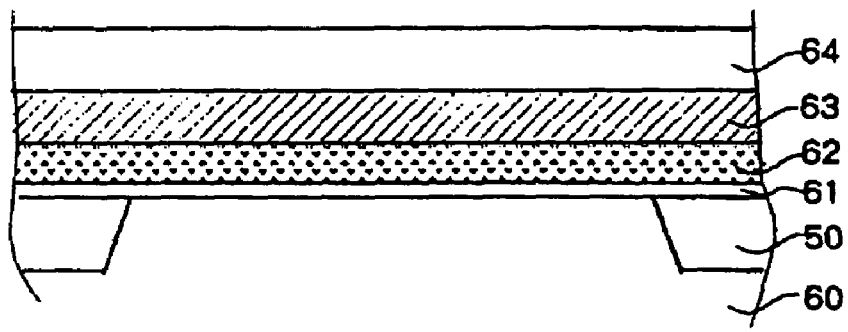
FIG. 5a is a schematic cross-sectional view illustrating how a gate insulating film, a gate electrode, and a mask nitride film are laminated on a silicon substrate.
Figure 5B:
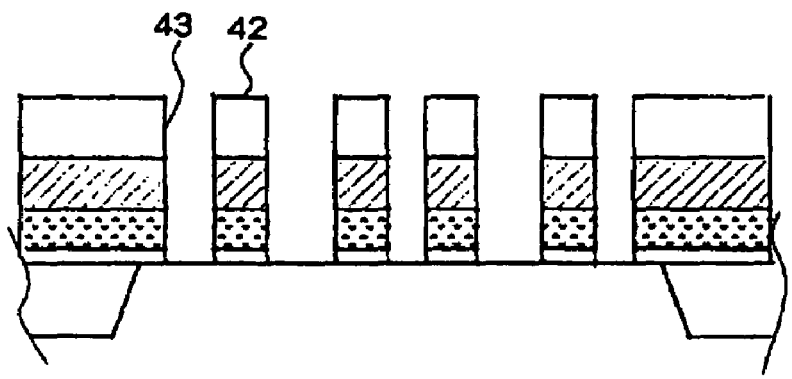
FIG. 5b is a schematic cross-sectional view illustrating how gate electrodes are formed on the silicon substrate, and how gate electrodes are formed along edges of a diffusion layer.
Figure 5C:
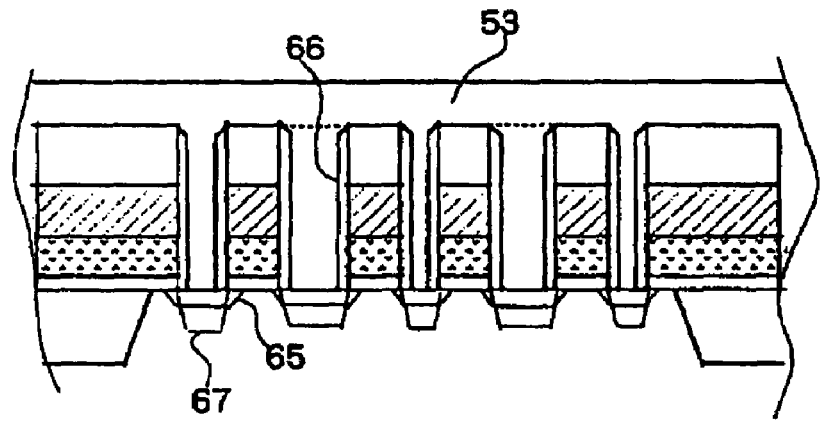
FIG. 5c is a schematic cross-sectional view illustrating formation of a diffusion layer and side wall insulating layers, and subsequent deposition of polysilicon.
Figure 5D:
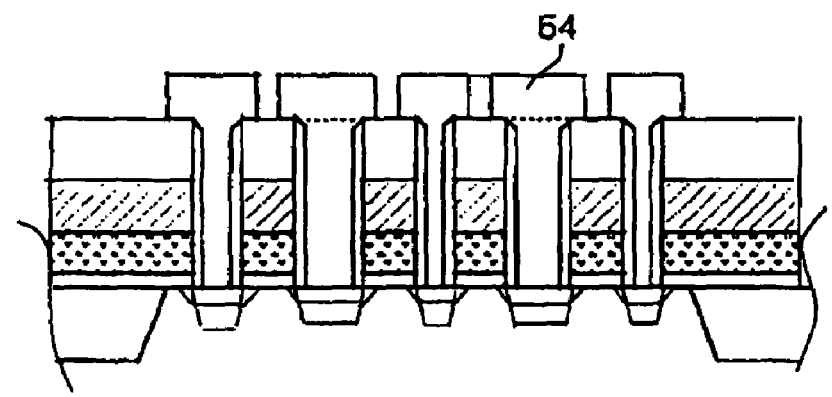
FIG. 5d is a schematic cross-sectional view illustrating how poly-pads are formed from the polysilicon.

FIG. 5a is a schematic cross-sectional view illustrating how gate insulating film, a gate electrode, and a mask nitride film are laminated on a silicon substrate; FIG. 5b is a schematic cross-sectional view illustrating how gate electrodes are formed on the silicon substrate, and how gate electrodes are formed along the edges of a diffusion layer; FIG. 5c is a schematic cross-sectional view illustrating the formation of a diffusion layer and side wall insulating layers, and subsequent deposition of polysilicon; and FIG. 5d is a schematic cross-sectional view illustrating how poly-pads are formed from the polysilicon.

Figure 5E:
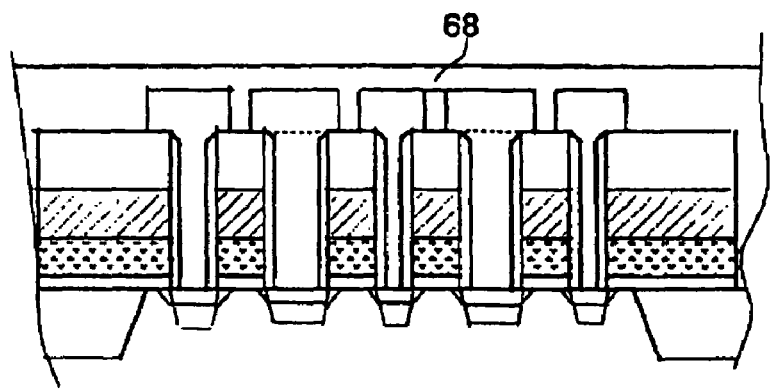
FIG. 5e is a schematic cross-sectional view illustrating how a first inter-layer insulating film is deposited.
Figure 5F:
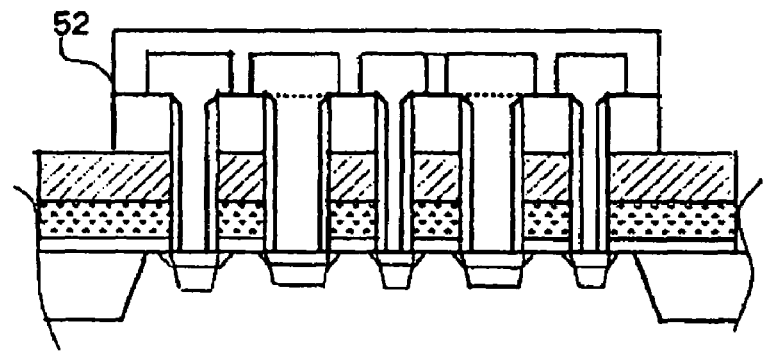
FIG. 5f is a schematic cross-sectional view illustrating how a mask is formed for forming gate electrodes from the first inter-layer insulating film.
Figure 5G:
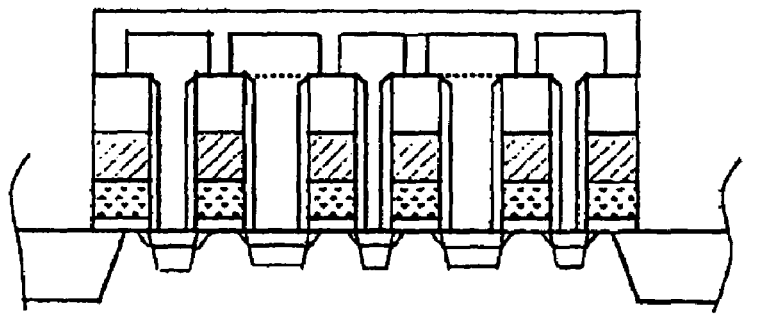
FIG. 5g is a schematic cross-sectional view illustrating how an upper gate electrode and a lower gate electrode are etched through the mask.
Figure 5H:
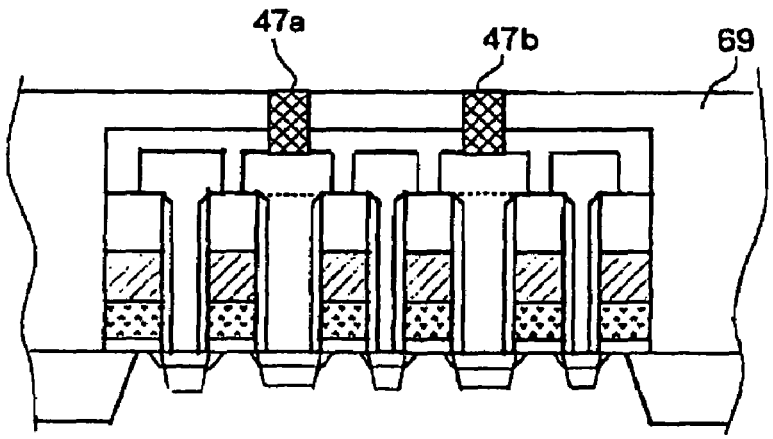
FIG. 5h is a schematic cross-sectional view illustrating deposition of a second inter-layer insulating film, and formation of contacts within annular gate electrodes.

FIG. 5e is a schematic cross-sectional view illustrating how a first inter-layer insulating film is deposited; FIG. 5f is a schematic cross-sectional view illustrating how a mask is formed for forming gate electrodes from the first inter-layer insulating film; FIG. 5g is a schematic cross-sectional view illustrating how an upper gate electrode and a lower gate electrode are etched through the mask; and FIG. 5h is a schematic cross-sectional view illustrating how a second inter-layer insulating film is deposited, and how contacts are formed within annular gate electrodes.

As illustrated in FIG. 5a, shallow trench isolation (STI) area 50 is first formed within silicon substrate 60. Next, gate insulating film 61 is formed on silicon substrate 60, and on gate insulating film 61, polysilicon having a thickness of 70 nm is formed to serve as lower gate electrode 62, and W/WN having a thickness of 100 nm is formed to serve as upper gate electrode 63. Next, mask nitride film 64 is deposited to a thickness of 120 nm on upper gate electrode 63 because mask nitride film is required for processing gate electrodes and for forming cell contacts in cell areas.

Next, as illustrated in FIG. 5b, gate electrodes 42 are formed using a known photolithographic process and etching process. In this event, gate electrodes 43 are also formed simultaneously along the edges of diffusion layer 41 to bestride the boundaries between diffusion layer 41 and STI area 50.

Next, as illustrated in FIG. 5c, diffusion layer 65 having a low impurity concentration is formed in silicon substrate 60, which is to serve as diffusion layer 41, using an ion injection process. Next, sidewall insulating films 66 are formed to a thickness of approximately 70 nm on the side surfaces of gate electrodes 42 and on side surfaces along sides 43, running within the sense amplifier, of gate electrodes 51 formed to bestride the respective boundaries between diffusion layer 41 and STI area 50, and then, diffusion layer 67 having a high impurity concentration is formed in low impurity concentration diffusion layer 65, using an ion injection process. Next, poly-silicon 53 is deposited to serve as poly-pads 54.

Next, as illustrated in FIG. 5d, poly-pads 54 are formed from polysilicon 53 using a known photolithographic process and etching process.

Next, as illustrated in FIG. 5e, first inter-layer insulating film 68 is deposited and planarized using a known planarization method.

Next, as illustrated in FIG. 5f, a mask is formed using a known photolithographic process and etching process for forming gate electrodes 51 formed along the edges of diffusion layer 41 to bestride the respective boundaries between diffusion layer 41 and STI area 50. In this event, the mask is formed in the previously formed sense amplifier, and the oxide film and nitride film are left on gate electrodes 51 along the edges of diffusion layer 41. Also, side 52 of gate electrode 51 opposite to the sense amplifier is formed along each edge of diffusion layer 41.

Next, as illustrated in FIG. 5g, upper gate electrodes 63 and lower gate electrodes 62 of gate electrodes 51 along the edges of diffusion layer 41 are etched using first inter-layer insulating film 68 as a mask.

Next, as illustrated in FIG. 5h, second inter-layer insulating film 69 is deposited and planarized using a known planarization method. Subsequently, contact holes are opened for connecting MOSFET bit lines using a normal photolithographic process and etching process, and are embedded with W to form W plugs, thus forming contacts 47a, 47b within annular gate electrodes 42. In this event, contacts 46 on poly-pads 54 on diffusion layer 41 may be formed simultaneously with contacts 48 on gate electrodes 42, or they may be formed separately, without any particular impact on the semiconductor memory of the present invention.

While some embodiments of the present invention have been described, it should be understood that the present invention is not limited to those embodiments, and a variety of modifications can be made without departing from the spirit and scope of the invention.

What is claimed is:

1. A semiconductor memory comprising a sense amplifier including at least one pair of MOSFETs, wherein:
    said pair of MOSFETs are arranged in point symmetry relationship to each other about the center of said sense amplifier, and
    said semiconductor memory further comprises additional gate electrodes each formed in an area in which a diffusion layer formed in said sense amplifier is in contact with a shallow trench isolation area for defining said sense amplifier such that said gate electrode spreads over said diffusion layer and over said shallow trench isolation area.

2. The semiconductor memory according to claim 1, wherein said gate electrodes are formed to spread over said diffusion layer and over said shallow trench isolation such that the side edges thereof hold a same spacing from side edges of gate electrodes in said pair of MOSFETs.

3. The semiconductor memory according to claim 1, further comprising:
    an inter-layer insulating film formed in internal areas surrounded by annular gate electrodes of said MOSFETs, and over an area outside said gate electrodes including said gate electrodes formed along edges of said diffusion layer in contact with said shallow trench isolation area; and
    contacts formed through said inter-layer insulating film.

4. The semiconductor memory according to claim 2, further comprising:
    an inter-layer insulating film formed in internal areas surrounded by annular gate electrodes of said MOSFETs, and over an area outside said gate electrodes including said gate electrodes formed along edges of said diffusion layer in contact with said shallow trench isolation area; and
    contacts formed through said inter-layer insulating film.

5. The semiconductor memory according to claim 1, further comprising:
    poly-pads formed in internal areas surrounded by annular gate electrodes of said MOSFETs, and in an area outside said gate electrodes, independently of one another;

an inter-layer insulating film formed on said poly-pads including said gate electrodes formed along edges of said diffusion layer in contact with said shallow trench isolation area; and contacts formed through said inter-layer insulating film.

6. The semiconductor memory according to claim 2, further comprising:

poly-pads formed in internal areas surrounded by annular gate electrodes of said MOSFETs, and in an area outside said gate electrodes, independently of one another;

an inter-layer insulating film formed on said poly-pads including said gate electrodes formed along edges of said diffusion layer in contact with said shallow trench isolation area; and contacts formed through said inter-layer insulating film.

7. A semiconductor memory comprising:

a shallow trench isolation area formed in a semiconductor substrate;

a diffusion layer surrounded by said shallow trench isolation area;

at least one pair of MOSFETs composing a sense amplifier and formed on said diffusion layer; and a plurality of electrodes spread over said diffusion layer and over said shallow trench isolation area, wherein:

said pair of MOSFETs are arranged in point symmetry relationship to each other about the center of said sense amplifier.

8. The semiconductor memory according to claim 7, wherein:

said pair of MOSFETs include a first gate electrode and a second gate electrode;

said plurality of electrodes include a first electrode opposite to said first gate electrode and a second electrode opposite to said second gate electrode; and a space between said first gate electrode and said first electrode is equal to a space between said second gate electrode and said second electrode.

9. The semiconductor memory according to claim 7, wherein:

said pair of MOSFETs include a plurality of gate electrodes; and said plurality of gate electrodes have annular shapes.

10. The semiconductor memory according to claim 7, further comprising:

an inter-layer insulating film formed on said semiconductor substrate and covering said pair of MOSFETs and said edge gate electrodes; and a plurality of contacts formed through said inter-layer insulating film.

11. The semiconductor memory according to claim 10, wherein:

said plurality of contacts are arranged in point symmetry relationship to each other about the center of said sense amplifier.

12. The semiconductor memory according to claim 9, further comprising:

a plurality of poly-pads formed within said gate electrodes of said pair of MOSFETs and within portions between said electrodes of said pair of MOSFETs and said edge gate electrodes.

* * * * *